US006913978B1

United States Patent
Chen et al.

(10) Patent No.: US 6,913,978 B1
(45) Date of Patent: Jul. 5, 2005

(54) METHOD FOR FORMING SHALLOW TRENCH ISOLATION STRUCTURE (75) Inventors: Neng-Kuo Chen, Hsinchu (TW);
Hsiu-Chuan Chu, Hsinchu (TW);
Chih-An Huang, Sindian (TW);
Hsiao-Ling Lu, Hsinchu (TW);
Teng-Chun Tsai, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/788,183

(22) Filed: Feb. 25, 2004

(51) Int. Cl.⁷ ............................................ H01L 21/336
(52) U.S. Cl. ...................................... 438/296; 438/426
(58) Field of Search .............................. 438/296, 424, 438/426, 435, 437

(56) References Cited

U.S. PATENT DOCUMENTS 6,017,800 A * 1/2000 Sayama et al. ............. 438/296
6,074,931 A * 6/2000 Chang et al. ............... 438/424
6,258,676 B1 * 7/2001 Lee et al. ................... 438/296
6,468,853 B1 * 10/2002 Balasubramanian et al. ........................... 438/424
6,790,746 B1 * 9/2004 Yang .......................... 438/296

* cited by examiner

Primary Examiner—Chandra Chaudhari
(74) Attorney, Agent, or Firm—J.C. Patents (57) ABSTRACT A method of fabricating a shallow trench isolation structure is disclosed. On a substrate, a pad oxide layer and a mask layer are successively formed. The pad oxide layer, the mask layer and a portion of the substrate are patterned to form a trench. After performing a rapid wet thermal process, a liner layer is formed on the exposed surface of the substrate, including the exposed silicon surface of the substrate in the trench and sidewalls and the surface of the mask layer. An oxide layer is deposited over the trench and the substrate and fills the trench. A planarization process is performed until the mask layer is exposed. The mask layer and the pad oxide layer are removed to complete the shallow trench isolation structure.

11 Claims, 9 Drawing Sheets

METHOD FOR FORMING SHALLOW TRENCH ISOLATION STRUCTURE

BACKGROUND OF THE INVENTION

1. Field of the Invention

The present invention relates in general to the fabrication of an integrated circuit (IC) device. More particularly, the present invention relates to a method of forming a shallow trench isolation (STI) structure.

2. Description of the Related Art

Integrated circuit (IC) usually contains thousands of metal-oxide semiconductor field effect transistors (MOSFET) or devices. As integration increases, isolation structures are now of great importance for isolating individual devices in high integration integrated circuits. Inferior isolation structures may cause short circuit between adjacent transistors. One of the most common used isolation structures is local oxidation (LOCOS), which is now a mature process with high reliability and efficiency. However, there are still several drawbacks of LOCOS, including stress, consequential problems due to stress and the formation of bird's beak. In particular, the formation of bird's beaks hinders development of high integration devices, especially for sub-quarter-micrometer technology. Therefore, another common isolation structure, shallow trench isolation (STI) structure, becomes more popular in high integration devices. Furthermore, STI technique can provide a global planar surface of the isolation structure, useful for the subsequent processes.

For the conventional STI fabrication processes, trenches are anisotropically etched into the silicon substrate by photolithography and dry etching and a silicon oxide layer is deposited to fill the trenches. Afterwards, chemical mechanical polishing (CMP) technology is used to planarize the oxide layer so as to form oxide plugs in the trenches. However, many challenges are encountered in the design of the STI process. Especially, the mechanical stress induced during the STI process has deleterious influences on the device characteristics. Usually, during the etching step or the following cleaning processes, the edges of the oxide plugs may be eroded, thus forming divot(s) between the top corners of the trenches and the oxide plugs. The divot tends to accumulate charges and consequently induces sub-threshold leakage current, which is so-called kink effect. The undesired kink effect reduces the isolation ability and the quality of the devices and also reduces the yield.

SUMMARY OF THE INVENTION

It is therefore an object of the invention to provide a method of forming a shallow trench isolation structure with a corner rounding step, consequently preventing formation of the divot around the top corners of the STI structure. Therefore, kink effects due to charge accumulation and the sub-threshold leakage current can be avoided.

A method of fabricating a shallow trench isolation structure is disclosed. On a substrate, a pad oxide layer and a mask layer are successively formed. The pad oxide layer, the mask layer and a portion of the substrate are patterned to form a trench. After performing a rapid wet thermal process, a liner layer is formed on the exposed surface of the substrate, including the exposed silicon surface of the substrate in the trench and sidewalls and the surface of the mask layer. An oxide layer is deposited over the trench and the substrate and fills the trench. A planarization process is performed until the mask layer is exposed. The mask layer and the pad oxide layer are removed to complete the shallow trench isolation structure.

BRIEF DESCRIPTION OF THE DRAWINGS

Other objects, features, and advantages of the invention will become apparent from the following detailed description of the preferred but non-limiting embodiments. The following description is made with reference to the accompanying drawings.

DESCRIPTION OF THE PREFERRED EMBODIMENT

Figure 1A:
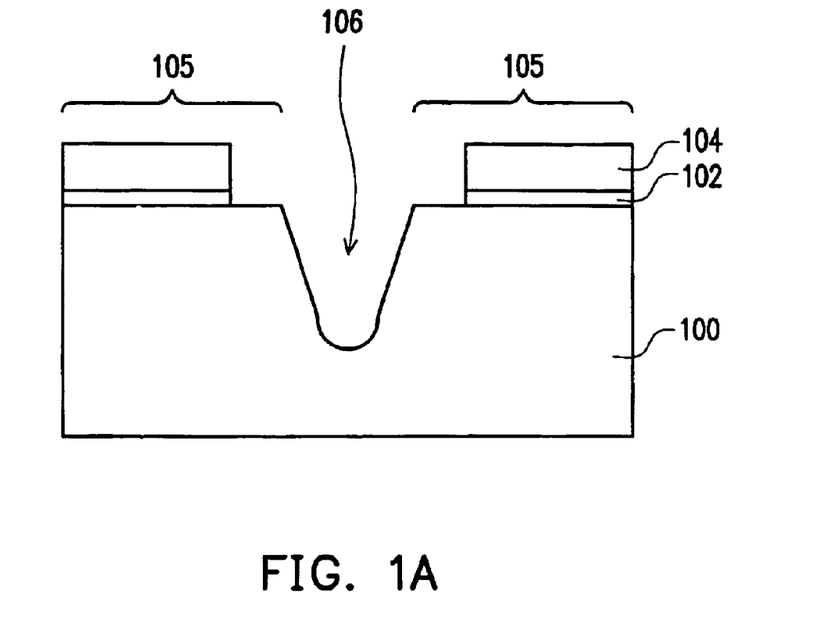
FIGS. 1A to 1F are cross-sectional views showing the process steps of fabricating a STI structure in accordance with a first preferred embodiment of the present invention.

FIGS. 1A to 1F are cross-sectional views showing the process steps of fabricating a STI structure in accordance with a first preferred embodiment of the present invention. Referring to FIG. 1A, on a provided semiconductor substrate 100, for example, a silicon substrate, a pad oxide 102 layer is formed by thermal oxidation. A silicon nitride layer 104 is formed on the pad oxide layer 102 by, for example, rapid thermal chemical vapor deposition (RTCVD) with a thickness of 1000–2000 Angstroms. Next, forming a patterned first photoresist layer (not shown) is formed on the silicon nitride layer 104. Through conventional techniques of photolithography and etching, the silicon nitride layer 104 and the pad oxide layer 102 are patterned. Using the patterned first photoresist layer and the patterned silicon nitride layer 104 as a mask, the active regions 105 are defined and at least a shallow trench 106 is formed into the substrate 100. After removing the first photoresist layer, a second patterned photoresist layer (not shown) is formed on the silicon nitride layer 104. Through conventional techniques of photolithography and etching, the silicon nitride layer 104 is partially removed to expose the substrate around the periphery of the shallow trench 106. This step is also called a pull-back step.

Figure 1B:
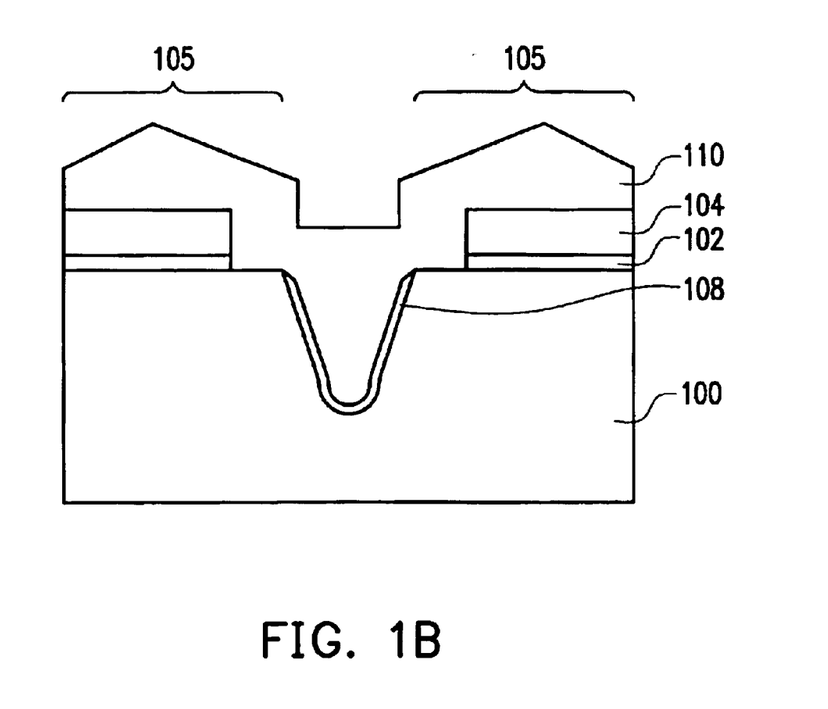

Referring to FIG. 1B, a liner layer 108 is formed on a surface of the shallow trench 106 by, for example, rapid thermal oxidation at a temperature above 900° C. The liner layer 108 is formed only on the exposed substrate surface in the shallow trench 106, but not on sidewalls and the surface of the silicon nitride layer 104. Preferably, the liner layer is a silicon oxide liner layer.

A first oxide layer 110 is deposited over the substrate, covering the silicon nitride layer 104 and filling the trench 106. The first oxide layer 110 is, for example, formed by high density plasma chemical vapor deposition (HDPCVD) with a thickness of about 3000–5000 Angstroms.

Figure 1C:
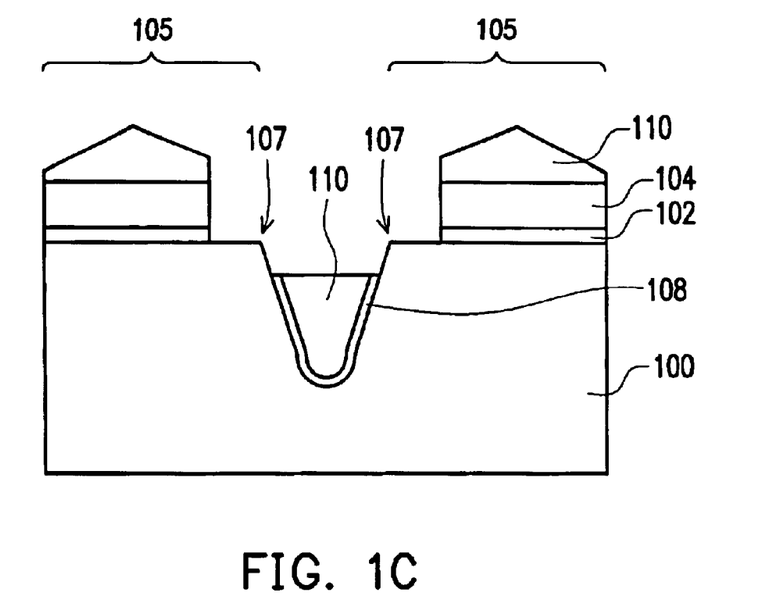

Referring to FIG. 1C, an etching back step is performed to remove a portion of the first oxide layer 110, a portion of the liner layer 108 until the silicon nitride layer and the top corners 107 of the trench 106 are exposed and a top surface of the remained first oxide layer 110 is lower than the pad oxide layer 102. Preferably, the etching back step is performed by wet etching, for example, buffered oxide etching (BOE).

Figure 1D:
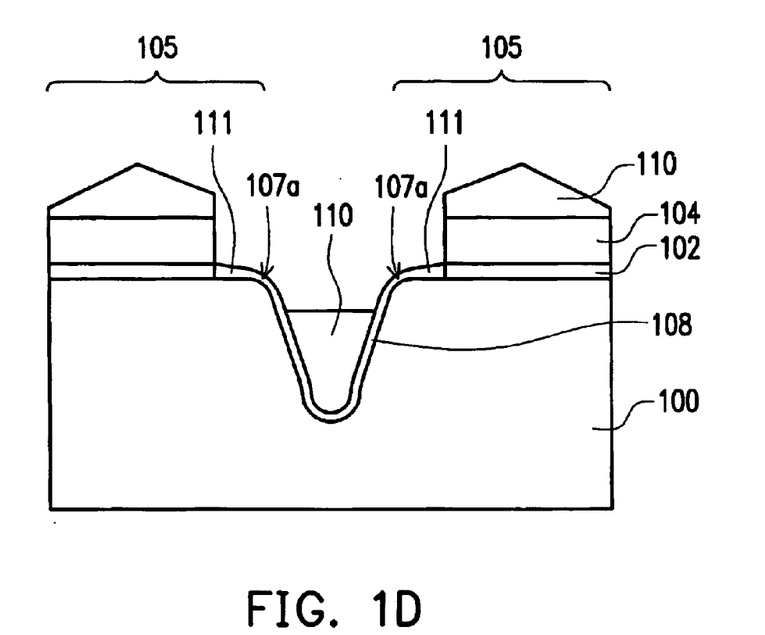

Referring to FIG. 1D, a corner rounding step is conducted by performing a rapid thermal process, so that the exposed substrate surface of the trench 106 and the exposed top corners 107 of the trenches are oxidized, thus forming a silicon oxide layer 111 covering the exposed surface of the trench 106 and the rounded top corners 107a of the trench 106. In this corner rounding step, the rapid thermal process not only rounded the top corners of the trench by consuming a small portion of the substrate at the exposed top corners, but also help restore defects caused by the mechanical stress around the edges of the trench. The rapid thermal process is preferably performed under 800–1000° C. for 80–150 seconds, for example. However, the conditions of the rapid thermal process can be adjusted according to the layout design, the pitch width and the aspect ratios of the trenches.

Figure 1E:
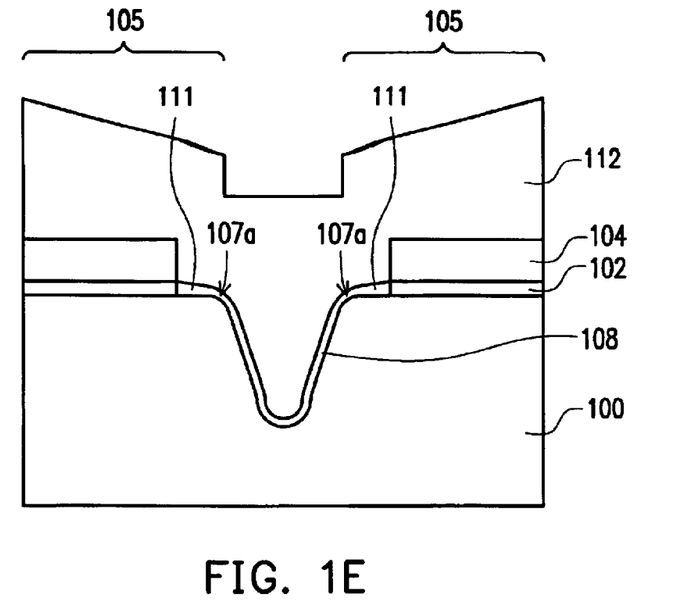

Referring to FIG. 1E, a second oxide layer 112 is deposited over the substrate 100, covering the silicon nitride layer 104 and filling up the trench 106. The second oxide layer 112 is, for example, formed by high density plasma chemical vapor deposition (HDPCVD) with a thickness of about 2000–4000 Angstroms. Alternatively, depending on the design choices, the first and second oxide layers can be further densified, for example, under 1000° C. for 10–30 minutes.

Figure 1F:
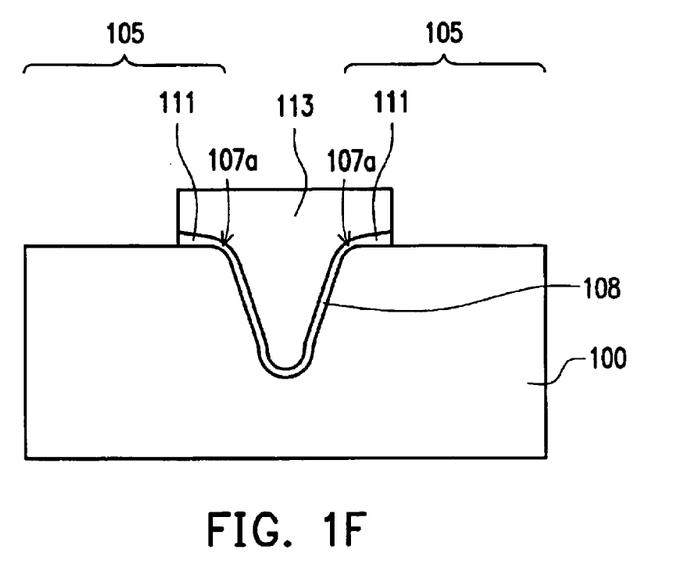

Referring to FIG. 1F, chemical mechanical polishing (CMP) is used to planarize the oxide layer 112 until the silicon nitride layer 104 is exposed, so that an oxide plug 113 is formed within the trench 106. Next, the silicon nitride layer 104 is first removed by hot phosphoric acid and then the pad oxide layer 102 is removed by hydrofluoric acid.

In the first embodiment, after patterning the silicon nitride layer and the forming the trench in the substrate, the pull-up step is subsequently performed.

However, as the pitch lengths continue to scale down, the distance between the active areas and sidewalls of the isolation structure becomes shorter. Hence, following the continuous shrinkage of the line-widths, especially for the deep sub-micron generation or the sub-90 nm generation, it becomes more difficult to perform pattern transfer with high accuracy when fabricating smaller dimension devices. Since the process window for pattern transfer is pretty small, it is advantageous to skip the pull-back step in the fabrication processes of STI structure, thus increasing the yield and lowering the costs.

Figure 2A:
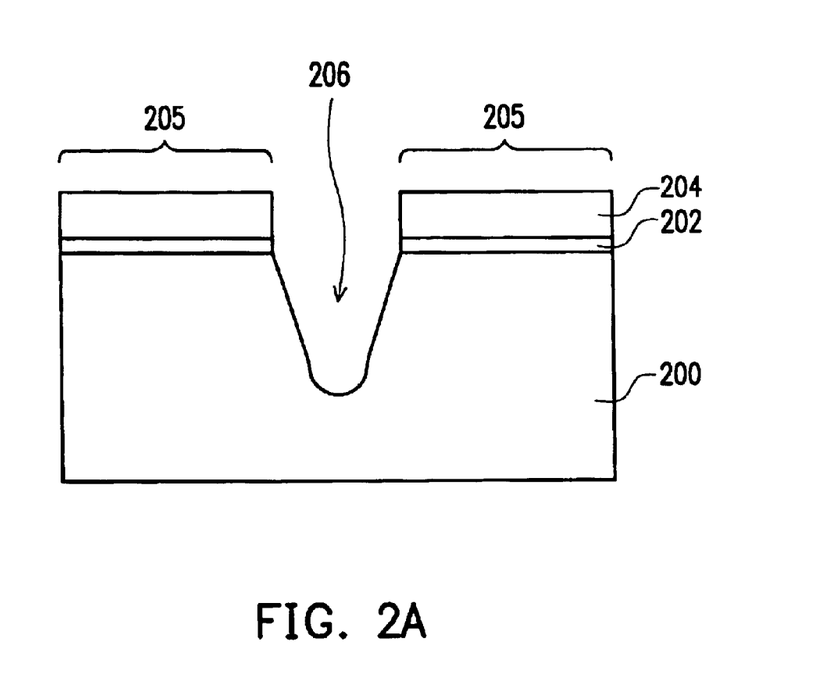
FIGS. 2A to 2F are cross-sectional views showing the process steps of fabricating a STI structure in accordance with a second preferred embodiment of the present invention.

According to the following embodiment, the pull-back step is skipped. FIGS. 2A to 2F are cross-sectional views showing the process steps of fabricating a STI structure in accordance with a second preferred embodiment of the present invention. Referring to FIG. 2A, a pad oxide 202 layer is formed by thermal oxidation on a provided semiconductor substrate 200, for example, a silicon substrate. A silicon nitride layer 204 is formed on the pad oxide layer 202 by, for example, rapid thermal chemical vapor deposition (RTCVD) with a thickness of 1000–2000 Angstroms. Next, forming a patterned photoresist layer (not shown) is formed on the silicon nitride layer 204. Through conventional techniques of photolithography and etching, the silicon nitride layer 204 and the pad oxide layer 202 are patterned. Using the patterned photoresist layer and the patterned silicon nitride layer 204 as a mask, the active regions 205 are defined and at least a shallow trench 206 is formed into the substrate 200. Next, the photoresist layer is removed.

Figure 2B:
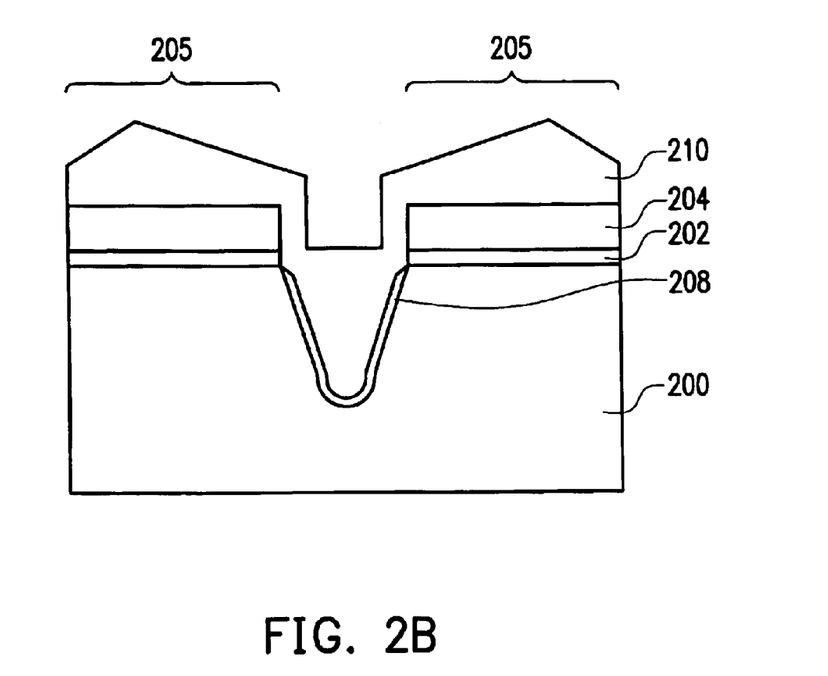

Referring to FIG. 2B, a liner layer 208 is formed on a surface of the shallow trench 206 by, for example, rapid thermal oxidation at a temperature above 900° C. The liner layer 208 is formed only on the exposed substrate surface in the shallow trench 206, but not on sidewalls and the surface of the silicon nitride layer 204. Preferably, the liner layer is a silicon oxide liner layer.

A first oxide layer 210 is deposited over the substrate, covering the silicon nitride layer 204 and filling the trench 206. The first oxide layer 210 is, for example, formed by high density plasma chemical vapor deposition (HDPCVD) with a thickness of about 3000–5000 Angstroms.

Figure 2C:
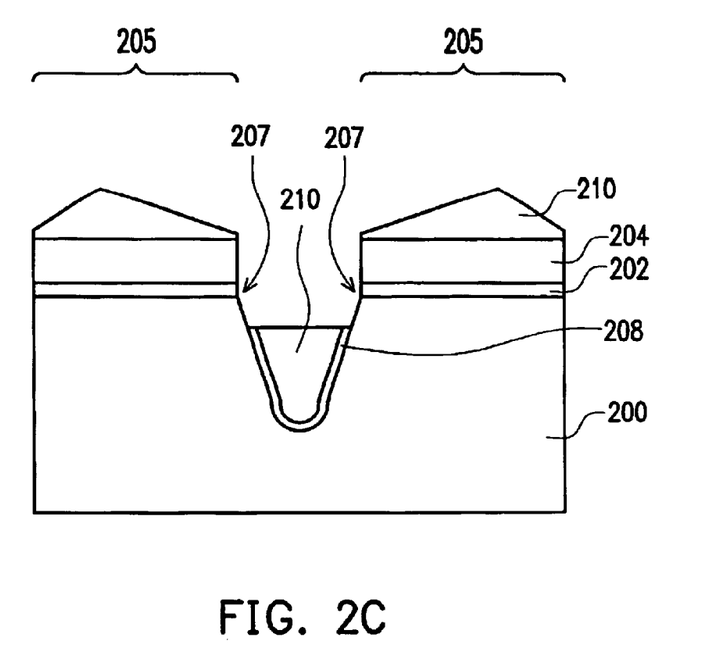

Referring to FIG. 2C, an etching back step is performed to remove a portion of the first oxide layer 210, a portion of the liner layer 208 until the silicon nitride layer 204 and the top corners 207 of the trench 206 are exposed and a top surface of the remained first oxide layer 210 is lower than the pad oxide layer 202. Preferably, the etching back step is performed by wet etching, for example, buffered oxide etching (BOE).

Figure 2D:
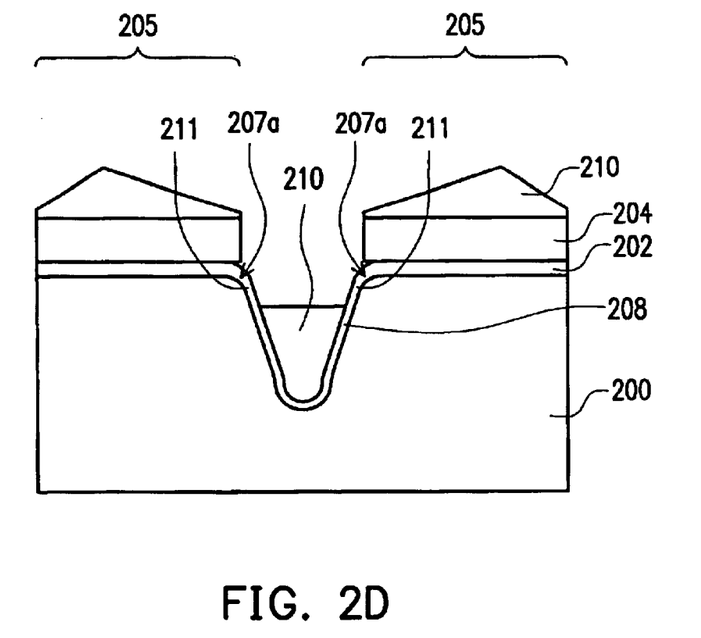

Referring to FIG. 2D, a corner rounding step is conducted by performing a rapid thermal process, so that the exposed substrate surface of the trench 206 and the exposed top corners 207 of the trenches are oxidized, thus forming a silicon oxide layer 211 covering the exposed surface of the trench 206 and the rounded top corners 207a of the trench 206. In this corner rounding step, the rapid thermal process not only rounded the top corners of the trench by consuming a small portion of the substrate at the exposed top corners, but also help restore defects caused by the mechanical stress around the edges of the trench. The rapid thermal process is preferably performed under 800–1000° C. for 80–150 seconds, for example. However, the conditions of the rapid thermal process can be adjusted according to the layout design, the pitch width and the aspect ratios of the trenches.

Figure 2E:
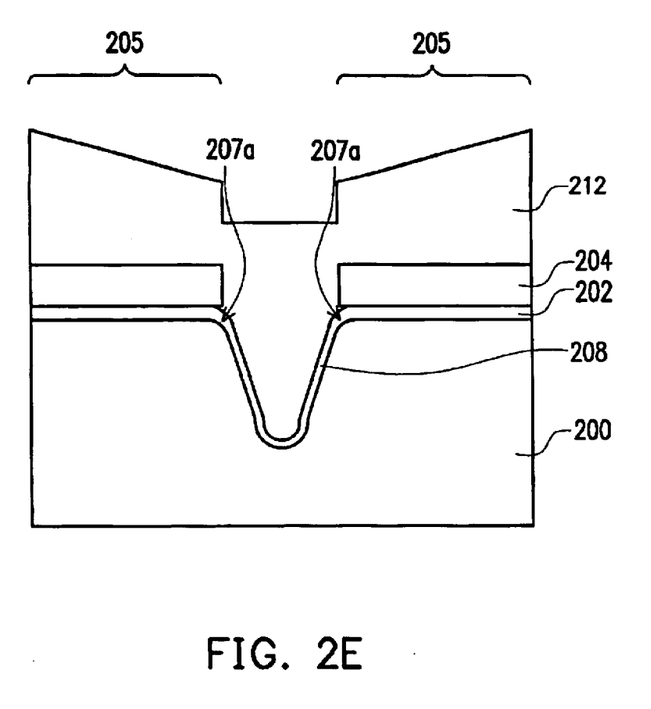

Referring to FIG. 2E, a second oxide layer 212 is deposited over the substrate 200, covering the silicon nitride layer 204 and filling up the trench 206. The second oxide layer 212 is, for example, formed by high density plasma chemical vapor deposition (HDPCVD) with a thickness of about 2000–4000 Angstroms. Alternatively, depending on the design choices, the first and second oxide layers can be further densified, for example, under 1000° C. for 20–30 minutes.

Figure 2F:
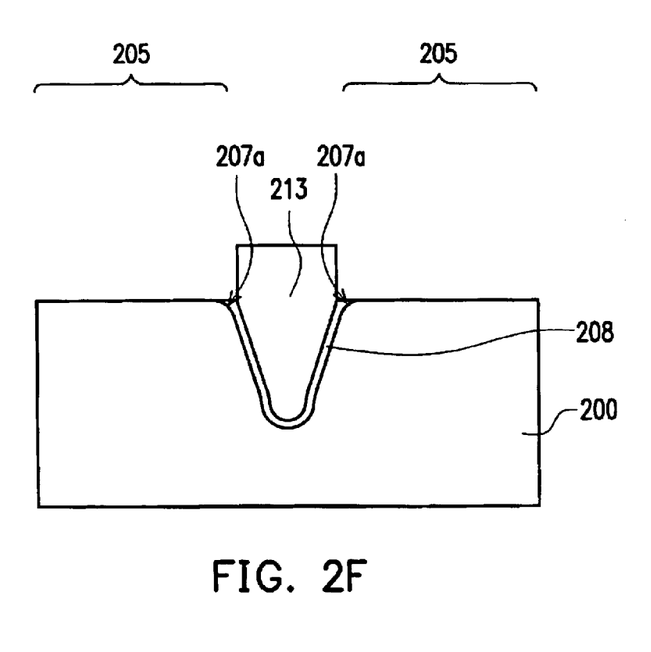

Referring to FIG. 2F, chemical mechanical polishing (CMP) is used to planarize the oxide layer 212 until the silicon nitride layer 204 is exposed, so that an oxide plug 213 is formed within the trench 206. Next, the silicon nitride layer 204 is first removed by hot phosphoric acid and then the pad oxide layer 202 is removed by hydrofluoric acid.

The rounded corners 107a, 207a of the trench 106, 206 avoid charge accumulation and consequently prevent kink effect, further raising the quality of the devices and the yield. Moreover, because the top corners 107a, 207a of the trench 106, 206 have been rounded before removing the silicon nitride layer and the pad oxide layer, it is unlikely to have charge accumulation or divot formed between the top corners of the trenches and the oxide plugs, even though minor recesses are unintentionally formed around the edge of the oxide plug.

It is therefore apparent that the present includes at least the following characteristics: performing a corner rounding step to round the top corners of the trench for the isolation structure, thus preventing the divots being formed around the top corners of the STI structure. Consequently, kink effect is improved and leakage current is reduced, further enhancing the performance of the device.

Figure 3:
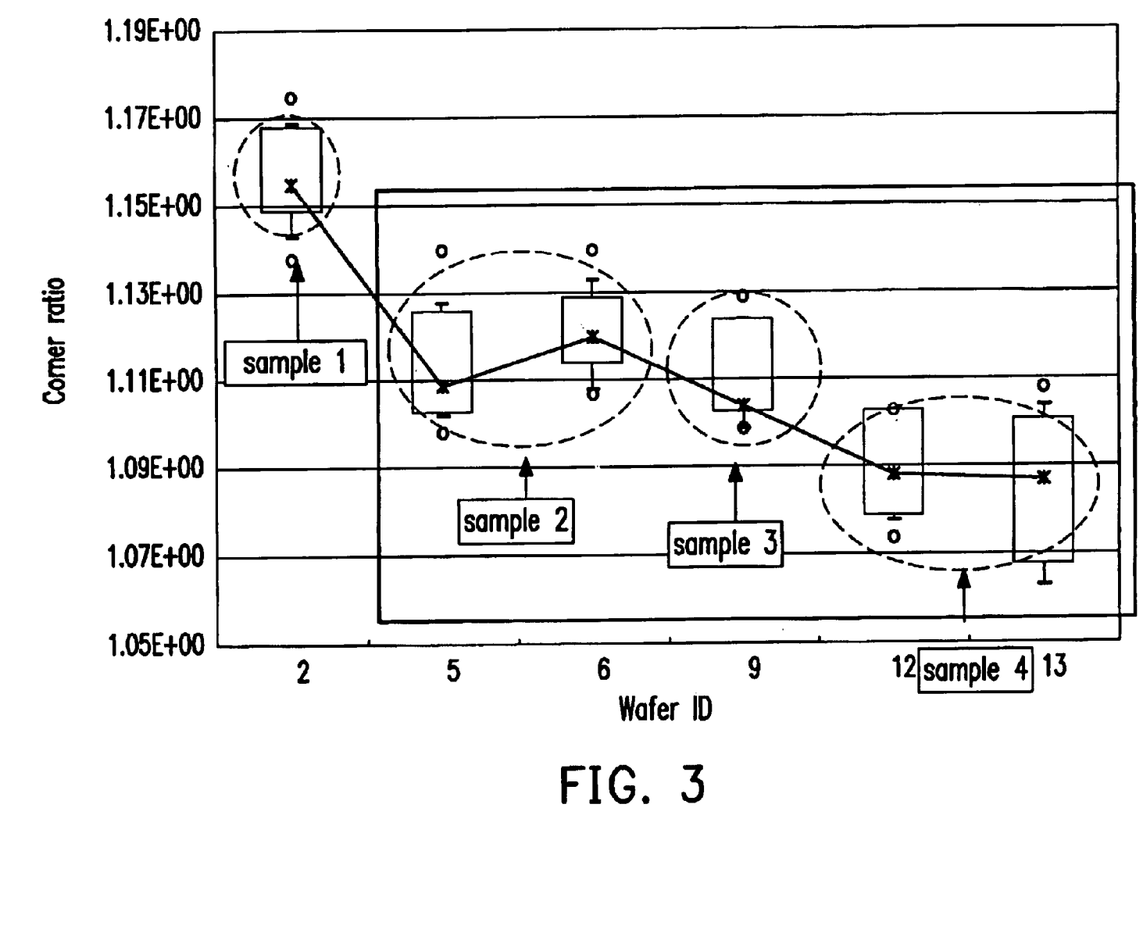
FIG. 3 is a chart illustrating corner ratios vs. various wafers subject to different fabrication process steps, while the pull-back step is skipped.
Figure 4A:
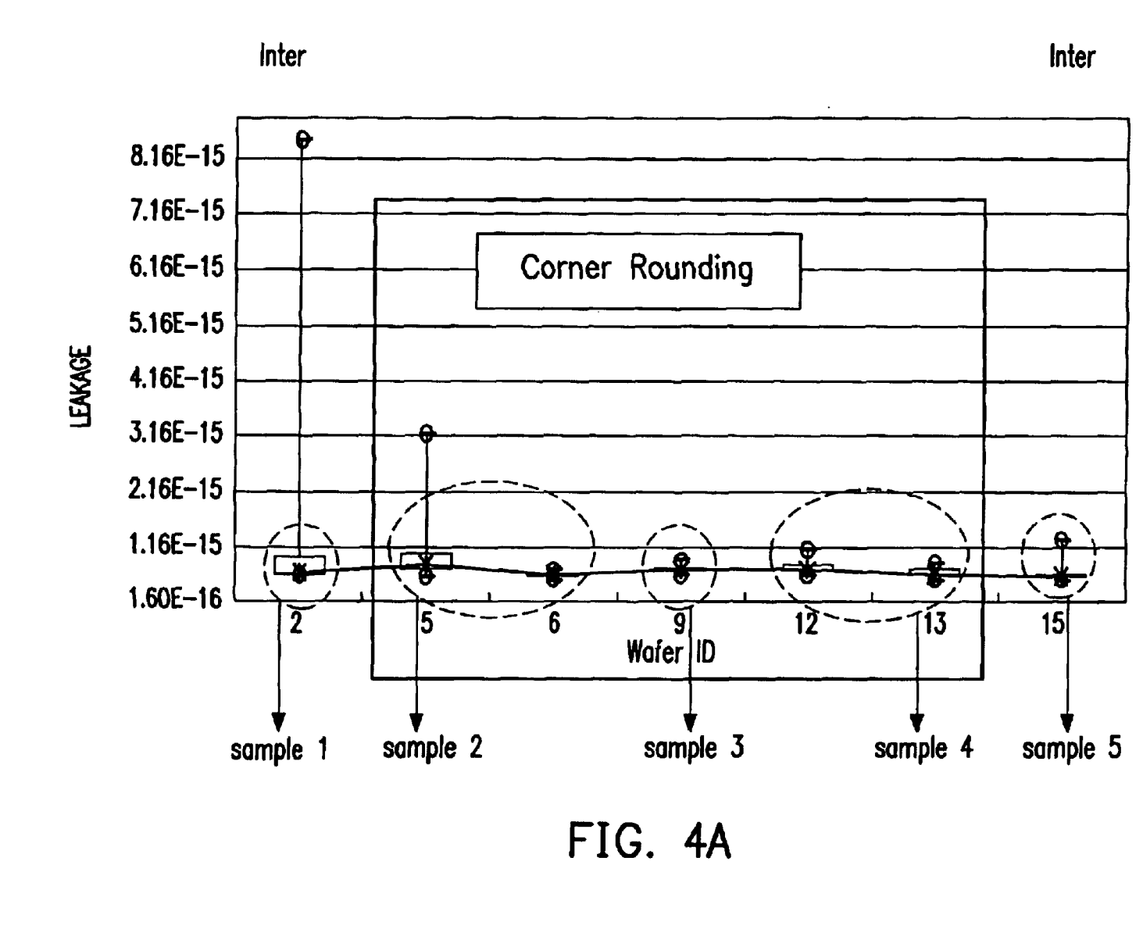
FIGS. 4A and 4B are diagrams illustrating leakage currents vs. various wafers subject to different fabrication process steps.
Figure 4B:
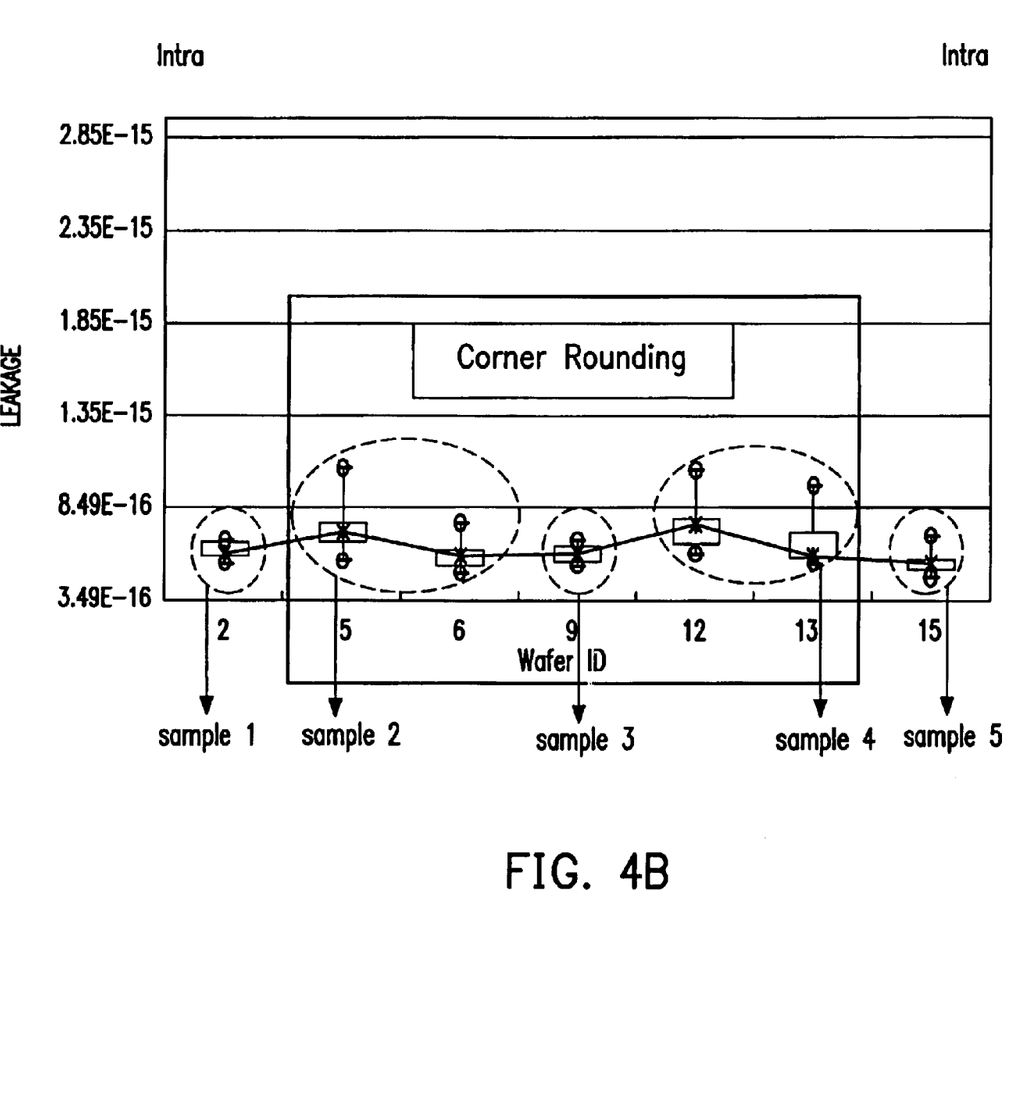

The electrical properties of the STI structure fabricated by the method of this invention are tested and measured, and the results are shown in FIGS. 3 and 4.

FIG. 3 is a chart illustrating corner ratios vs. various wafers subject to different fabrication process steps, while the pull-back step is skipped. Sample 1: the wafer 2 undergoing deposition, etching back and re-deposition steps, but without the corner rounding step; sample 2: the wafers 5, 6 undergoing deposition, wet etching for 30 seconds, corner rounding and re-deposition steps; sample 3: the wafer 9 undergoing deposition, wet etching for 35 seconds, corner rounding and re-deposition steps; and sample 4: the wafers 12, 13 undergoing deposition, wet etching for 40 seconds, corner rounding and re-deposition steps. It is clearly shown that the wafers subject to the corner rounding step have lower corner ratios (i.e. less leakage), when compared with the wafer without undergoing the corner rounding step.

Similarly, the above wafers were tested for their isolation capability. FIGS. 4A and 4B are diagrams illustrating leakage currents vs. various wafers subject to different fabrication process steps. FIG. 4A illustrates the inter-well isolation between P+ doping region and the P-well, while FIG. 4B illustrates the intra-well isolation between the P-well and P-doing region. Samples 1–4 are the same as the above, and sample 5: the wafer 15 subject to the pull-back step and undergoing deposition, etching back and re-deposition steps. From FIGS. 4A and 4B, it is noted that the isolation capability is almost the same for the wafers undergoing the corner rounding step and the wafers without the corner rounding step, either with or without the pull-back step. Therefore, the corner rounding step does not cause destructive impacts on the isolation capability of the isolation structure.

While the invention has been described by way of example and in terms of a preferred embodiment, it is to be understood that the invention is not limited thereto. To the contrary, it is intended to cover various modifications and similar arrangements and procedures, such as the formation of a multiple voltage transistor. The scope of the appended claims therefore should be accorded the broadest interpretation so as to encompass all such modifications and similar arrangements and procedures.

What is claimed is:

1. A method for forming a shallow trench isolation structure, comprising:

providing a substrate;

forming a pad oxide layer and a mask layer successively on the substrate;

patterning the pad oxide layer and the mask layer;

patterning the substrate to form at least a trench in the substrate, using the patterned mask layer as a mask;

forming a first insulating layer over the substrate and filling the trench;

performing an etching back step to remove a portion of the first insulating layer until top corners of the trench are exposed and a top surface of the remained first insulating layer is lower than the pad oxide layer;

performing a rapid thermal process to form an oxide liner layer on an exposed surface of the substrate, including the exposed top corners of the trench;

forming a second insulating layer over the trench and the substrate and filling the trench, after performing the rapid thermal process;

performing a planarization process to the second insulating layer until the mask layer is exposed; and removing the mask layer and the pad oxide layer to form the shallow trench isolation structure.

2. The method as claimed in claim 1, wherein the step for forming the pad oxide layer includes a thermal oxidation process and the step for forming the mask layer comprises forming a silicon nitride layer by rapid thermal chemical vapor deposition.

3. The method as claimed in claim 1, wherein the step of forming the first insulating layer includes high density plasma chemical vapor deposition, and the first insulating layer comprises an oxide layer.

4. The method as claimed in claim 1, wherein the step for forming the second insulating layer includes high density plasma chemical vapor deposition, and the second insulating layer comprises an oxide layer.

5. The method as claimed in claim 1, wherein the rapid thermal process is performed at a temperature of about 800° C.–1000° C.

6. The method as claimed in claim 1, wherein the step for patterning the substrate to form the trench comprises anisotropic etching.

7. The method as claimed in claim 1, wherein the planarization process includes chemical mechanical polishing.

8. The method as claimed in claim 1, wherein the step of performing the etching back step includes performing buffered oxide etching.

9. The method as claimed in claim 1, further comprising forming a liner layer, after patterning the pad oxide layer, the mask layer and the substrate to form at least the trench and before forming the first insulating layer.

10. The method as claimed in claim 1, further comprising performing a pull-back step by patterning the mask layer and the pad oxide layer to expose a portion of the substrate near edges of the trench, after patterning the pad oxide layer, the mask layer and the substrate to form at least the trench and before forming the first insulating layer.

11. The method as claimed in claim 10, further comprising forming a liner layer, after the pull-back step and before forming the first insulating layer.

* * * * *